United States Patent [19]

Hickernell et al.

[11] Patent Number: 5,389,806
[45] Date of Patent: Feb. 14, 1995

[54] APPARATUS FOR REDUCING HETEROSTRUCTURE ACOUSTIC CHARGE TRANSPORT DEVICE SAW DRIVE POWER REQUIREMENTS

[75] Inventors: Fred S. Hickernell, Phoenix; Frederick Y.-T. Cho, Scottsdale; Frederick M. Fliegel, Phoenix, all of Ariz.

[73] Assignee: Motorola, Inc., Schaumburg, Ill.

[21] Appl. No.: 985,059

[22] Filed: Dec. 2, 1992

Related U.S. Application Data

[63] Continuation-in-part of Ser. No. 836,165, Feb. 18, 1992, abandoned, which is a continuation of Ser. No. 577,180, Sep. 4, 1990, abandoned.

[51] Int. Cl.$^6$ ............................................. H01L 29/796
[52] U.S. Cl. ................................. 257/239; 257/183.1; 257/217; 257/245
[58] Field of Search ................... 357/24; 377/57–63; 257/183.1, 217, 245, 239

[56] References Cited

U.S. PATENT DOCUMENTS

| | | | |
|---|---|---|---|
| 3,858,232 | 12/1974 | Boyle et al. | 357/24 |
| 4,499,440 | 2/1985 | Grudkowski | 333/151 |
| 4,633,285 | 12/1986 | Hunsinger et al. | 357/26 |
| 4,799,244 | 1/1989 | Mikoshiba et al. | 357/24 |
| 4,893,161 | 1/1990 | Tanski et al. | 357/24 |
| 4,906,885 | 3/1990 | Kojima et al. | 310/313 B |
| 4,926,083 | 5/1990 | Merritt et al. | 310/313 R |
| 4,942,327 | 7/1990 | Watanabe et al. | 310/313 R |
| 4,980,596 | 12/1990 | Sacks et al. | 310/313 D |
| 5,039,957 | 8/1991 | Greer et al. | 331/107 A |

OTHER PUBLICATIONS

A note entitled "Comment on Surface acoustic wave properties of aluminum Gallium Arsenide" [J. Appl. Phys. 66,90 (1989)] by F. M. Fliegel et al., J. Appl. Phys. 69(4), 15 Feb. 1991.

An article entitled "A Synopsis of Surface Acoustic Wave Propagation on {100}-Cut<110>-Propagating Gallium Arsenide" by W. D. Hunt et al. (J. Appl. Phys. 69(4), 15 Feb. 1991).

An excerpt from the book entitled *Acoustic Change Transport: Device Technology and Applications*, by R. L. Miller et al., Copyright 1992, Artech House, Inc., Norwood, Mass., pp. 68–69.

An excerpt from the book entitlted *Gallium Arsenide Processing Technique*, by R. E. Williams, Copyright 1984, Artech House, Inc., Dedham, Mass., p. 79.

An excerpt from the book entitled *Physics of Semiconductor Devices*, by S. M. Sze, Copyright 1969, John Wiley & Sons, Inc., p. 140.

An excerpt from the book entitled *Solid State Electronic Devices*, by B. G. Streetman et al., Copyright 1972, Prentice-Hall, Inc., Englewood Cliffs, N.J., p. 244.

An article entitled "Acoustic Charge Transport in an (Al,Ga)As/GaAs Heterojunction Structure Grown by Molecular-beam Epitaxy", R. N. Sacks et al., Journal of Vacuum Science and Technology B, vol. 6, No. 2, Mar./Apr. 1988, pp. 685–687.

An article entitled "Heterojunction Acoustic Charge Transport Devices on GaAs", by W. J. Tanski et al., Applied Physics Letter 52(1), 4 Jan. 1988, pp. 18–20.

*Primary Examiner*—Gene M. Munson
*Attorney, Agent, or Firm*—Frederick M. Fliegel; Frank J. Bogacz

[57] ABSTRACT

A HACT device employing a thin-film overlay of a more strongly piezoelectric material can operate as a delay line and as a tapped delay line, or transversal filter, while requiring less total power for the SAW clock signal. The increased electrical potential per unit total SAW power thus realized facilitates coupling between the total SAW energy and the mobile charge carriers. Some materials systems, such as a GaAs substrate and a ZnO thin-film overlay, will require an intervening thin-film dielectric layer in between the HACT substrate and epitaxial layers and the thin-film piezoelectric overlay. This may be necessitated by chemical, semiconductor device processing, or adhesion incompatibilities between the substrate material and the thin-film overlay material.

2 Claims, 2 Drawing Sheets

APPARATUS FOR REDUCING HETEROSTRUCTURE ACOUSTIC CHARGE TRANSPORT DEVICE SAW DRIVE POWER REQUIREMENTS

This application is a continuation-in-part of prior application Ser. No. 07/836,165, filed Feb. 18, 1992, now abandoned, which is a continuation of prior application Ser. No. 577,180, filed Sep. 4, 1990, now abandoned.

BACKGROUND OF THE INVENTION

The present invention pertains to a heterostructure acoustic charge transport (HACT) devices and more particularly to an arrangement for improving device performance by reducing the magnitude of the surface acoustic wave (SAW) required for effective HACT device operation.

An HACT device employs a powerful ultra high frequency (UHF) SAW propagating on the top, highly polished surface of a wafer of piezoelectric semiconductor material, usually gallium arsenide (GaAs), to bunch mobile charge carriers in extrema of the SAW electrical potential and to then transport these discrete chart packets at the speed of sound through semiconductor material, as is described in detail in U.S. Pat. No. 4,893,161, entitled "Quantum-Well Acoustic Charge Transport Device," issued to William J. Tanski, Sears W. Merritt and Robert N. Sacks. Further information regarding ACT and HACT devices is found in U.S. Pat. No. 4,980,596, entitled "Acoustic Charge Transport Device Having Direct Optical Input", issued to R. N. Sacks et al.; U.S. Pat. No. 4,926,083, entitled Optically Modulated Acoustic Charge Transport Device", issued to S. W. Merritt et al.; U.S. Pat. No. 4,884,001, entitled "Monolithic Electro-Acoustic Device Having An Acoustic Charge Transport Device Integrated With A Transistor", issued to R. N. Sacks et al.; and U.S. Pat. No. 4,633,285, entitled "Acoustic Charge Transport Device And Method" issued to B. J. Hunsinger et al.; the above-noted patents are incorporated herein by reference. The SAW thus functions as an acoustic clocking signal, similarly to clocking signals in a conventional charge-coupled device (CCD), but without need for complex interconnections which CCDs require. SAW transducer/channel width design considerations are addressed in "A Synopsis of Surface Acoustic Wave Propagation on {100}-Cut <110>-Propagating Gallium Arsenide" by W. D. Hunt et al., (J. Appl. Phys. 69(4), pp. 1936–1941, Feb. 15, 1991), which is incorporated herein by reference.

CCDs, bucket brigade devices and related memory devices have the disadvantages that great fabrication complexity is necessary in order to provide the polyphase clocking signals required by such devices. Other disadvantages of such devices include limited practical clocking speed and substantial dark currents. The capacitive nature of the transfer electrodes to which the clocking signals are applied exacerbates difficulties involved in attempting to increase clocking speeds because these types of charge transfer devices tend to operate best when driven by clocking signals having sharp transitions, e.g., square waves, which are difficult to supply to capacitive loads such as clocking electrodes, especially at high frequencies.

Another class of device which has been experimentally demonstrated at low clocking frequencies (e.g., less than 100 MHz) but which has not shown transfer efficiencies of practical value even at these low clocking frequencies are based on metal-insulator-semiconductor (MIS) technology wherein a layer of strongly piezoelectric material is applied over a layer of native oxide to a semiconductor material such as silicon. These devices operate by first establishing a channel region at the semiconductor-oxide interface by means of an electrical bias which gives rise to an inversion layer (e.g., a two-dimensional minority carrier sheet) which is then subsequently bunched and synchronously transported by a SAW (or other acoustic wave) launched from a SAW transducer which is in proximity to the piezoelectric layer. Such devices have consistently had serious problems in practice including high surface state densities at the semiconductor-oxide interface, giving rise to charge trapping effects and poor charge transfer efficiency even at low clocking frequencies, high acoustic propagation losses (limiting practical channel lengths and hence storage times), incompatibility with Schottky electrode sensing techniques for non-destructive charge sensing, substantial dark currents due to the high electrical fields necessary to provide inversion layers and poor input-output isolation due to the necessary presence of a conductive layer immediately beneath the charge-carrying inversion layer (inversion layers can only be formed by biasing a conductive layer). A particular problem has been that most dielectric films provide high acoustic propagation losses. For these and other reasons related to device processing problems, acoustically clocked MIS structures have never proven practical as charge transfer devices. Examples of concepts for such devices are briefly mentioned in passing in Boyle et al., U.S. Pat. No. 3,858,232, issued Dec. 31, 1974 and in more detail in Mikoshiba et al., U.S. Pat. No. 4,799,244, issued Jan. 17, 1989. Experimental performance of such devices is discussed in Tsubouchi et al., "Charge Transfer by Surface Acoustic Waves on Monolithic MIS Structure", 1978 IEEE Ultrasonics Symposium Proceedings, pp. 20 through 24 while theoretical predictions of performance absent charge trapping are presented in "Modelling of Charge Transfer by Surface Acoustic Waves in a Monolithic Metal/ZnO/-SiO2/Si System" by F. Augustine et al., IEEE Transactions on Electron Devices, ED-29, No. 12, Dec. 1982, pp. 1876 through 1883. In "Fabrication-Related Effects in Metal-ZnO-SiO2-Si Structures", Cornell et al., Applied Physics Letters, Vol. 31, No. 9, Nov. 1, 1977, pp. 560 through 562, provides conclusive experimental evidence that the sputtering process used to deposit ZnO causes surface state problems which severely limit the performance of acoustically clocked devices using such structures. The above-noted patents and articles are hereby incorporated by reference.

The very weak piezoelectricity of GaAs ($k^2 = 7.4 \times 10^{-4}$ for the Rayleigh mode on {100}-cut, <110>-propagating GaAs) dictates that the great majority of energy in the SAW is manifested as mechanical energy and only a small portion of the total energy is manifested through the electrical potential which accompanies the SAW. It is this electrical component of total SAW energy which bunches charge carriers forming distinct packets and transporting these packets, representing the input signal, through the HACT device. Accordingly, present day ACT and HACT devices require large (about one Watt) acoustic power levels in order to realize the voltage required (about one Volt) to effect coherent charge packet transport within the HACT channel, synchronous with the SAW clock signal.

What is needed is a device architecture providing high charge transfer efficiency, long charge storage times, good frequency response, low clocking signal power requirements and low dark current.

Therefore, it is an advantage of the present invention to provide an HACT device which includes a greatly reduced acoustic power requirement for achieving coherent, synchronous charge transport.

SUMMARY OF THE INVENTION

In accomplishing the advantages of the present invention, a novel HACT device structure employing a thin-film overlay of another material is shown.

A heterostructure acoustic charge transport device includes a semiconductor substrate which has a surface and a source of electrical charge. The semiconductor substrate also includes a surface acoustic wave device which is coupled to the semiconductor substrate. The surface acoustic wave device operates in response to the applied electrical charge source to transport electric charge.

The semiconductor substrate also includes a channel which is disposed along the surface of the semiconductor substrate. The channel transports the electric charge in a particular direction in response to the surface acoustic wave device. Lastly, the semiconductor substrate includes a piezoelectric layer which is disposed over the channel. The piezoelectric layer facilitates transportation of the electric charge in the particular direction.

The above and other features and advantages of the present invention will be better understood from the following detailed description taken in conjunction with the accompanying drawings.

DESCRIPTION OF THE PREFERRED EMBODIMENT

A broad variety of different acoustic wave types have application in microwave acoustic devices such as that claimed herein, including surface acoustic waves (SAWs), also known as Rayleigh waves; surface skimming bulk acoustic waves (SSBWS or SSBAWs); pseudo surface waves or leaky surface waves; shallow bulk acoustic waves (SBAWs); surface transverse waves (STWs); Stonely, Sezawa, Love and other plate and higher order acoustic guided waves; longitudinal and shear bulk acoustic waves (BAWs) and the like. For convenience of explanation, the present invention is described in terms of SAWs, with the understanding that other varieties of acoustic propagation are also applicable, including but not limited to those listed above.

The terms "surface acoustic wave", "acoustic wave" and "surface wave" or "SAW" are employed interchangeably herein to stand for any suitable type of acoustic wave propagation. The terms "substrate material", "substrate" and "acoustic wave propagating substrate" are employed interchangeably herein to stand for any substrate supporting acoustic wave propagation.

A HACT device employing a thin-film overlay of a more strongly piezoelectric material can operate as a delay line and as a tapped delay line, or transversal filter, while requiring less total power for the SAW clock signal. The increased electrical potential per unit total SAW power thus realized facilitates coupling between the total SAW energy and the mobile charge carriers.

Some materials systems, such as a GaAs substrate and a ZnO thin-film overlay, will require an intervening thin-film dielectric layer in between the HACT substrate and epitaxial layers and the thin-film piezoelectric overlay. This may be necessitated by chemical, semiconductor device processing or adhesion incompatibilities between the substrate material and the thin-film overlay material.

Figure 1:
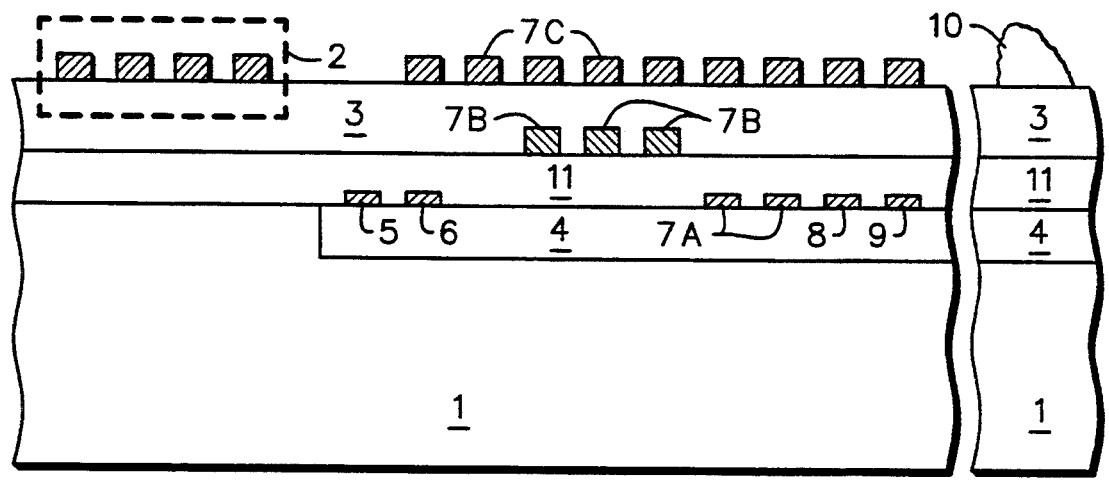
FIG. 1 is a longitudinal cross-sectional view of an HACT device employing a thin-film overlay of a dielectric and also another thin-film layer of material.

In acoustic charge transport (ACT) and in HACT technology, charge transport occurs in piezoelectric semiconductors (for example, {100}-cut, <110>-propagating GaAs) when mobile charge is injected into, and trapped within extrema of, the propagating electrical potential which is associated with a SAW. Referring to FIG. 1, semiconductor substrate 1 has incorporated upon it an interdigital metallic SAW transducer pattern 2 for generating the SAW in response to an applied external voltage having the appropriate frequency. SAW transduction is enhanced by means of an appropriate thin-film overlay 3 of a piezoelectric material, such as zinc oxide (ZnO), as discussed in "GaAs Monolithic SAW Devices for Signal Processing and Frequency Control," by T. W. Grudkowski, G. K. Montress, M. Gilden and J. F. Black, IEEE Catalogue No. 80CH1602-2, pages 88–97, aluminum nitride (AlN), as discussed in "Growth and Properties of Piezoelectric and Ferroelectric Films," by M. H. Francome and S. V. Krishnaswamy, in Journal of Vacuum Science and Technology A 8(3), pages 1382–1390, or lithium niobate ($LiNbO_3$) or other ferroelectric material, as discussed in the above and in "Metalorganic Chemical Vapor Deposition of $PbTiO_3$ Thin Films," by B. S. Kwak, E. P. Boyd and A. Erbil, in Applied Physics Letters, 53(18), pages 1702–1704, which articles are incorporated herein by reference. The travelling-wave electrical potential associated with the SAW is also enhanced by overlay layer 3. The SAW then propagates from left to right, for example, encountering the edge of epitaxial layers comprising channel 4, sweeping past input contact 5, where charge is injected into SAW electrical potential minima and entrained thereby. The amount of charge injected into any particular minimum of the travelling-wave electrical potential associated with the SAW is determined by the input signal magnitude of impressed upon input contact 5 when the SAW electrical potential minimum passes by input contact 5 and this particular charge packet magnitude remains invariant as the charge packet thus formed moves through HACT channel 4 at the speed of sound.

Input contact 5 is typically an ohmic contact to the semiconductor material comprising channel 4 and is commonly realized by depositing a eutectic mixture of AuGe (88:12) approximately one to two thousand Angstroms thick, followed by a few hundred Angstroms of Ni, for example, and which is alloyed to the semiconductor material by heating in a reducing atmosphere.

Rapid thermal and/or laser annealing, heating in a hydrogen furnace and other techniques well known in the semiconductor arts are successfully employed to form such ohmic contacts. Alternatively, other techniques known in the relevant arts for forming ohmic contacts may be employed.

The input electrode bias is formed by impressing a voltage difference between input ohmic contact 5 and input Schottky gate 6. Charge packets the move beneath nondestructive sensing (NDS) Schottky electrode array 7A and sensing electrode arrays 7B and 7C where charge capacitively couples to NDS electrodes 7A and sense electrodes 7B and 7C and forms image charges which replicate the channel charge and hence the charge representing the input signal.

NDS Schottky electrodes 7A are formed directly on the semiconductor material forming a top surface of channel 4. This is not possible for MIS-type devices wherein an inversion layer is employed because inversion layers forward bias Schottky contacts, draining charge carriers from and collapsing the inversion layer. In the SST device architecture disclosed herein, NDS electrodes 7A may be formed either on the top surface of channel 4, while additional sense electrodes 7B between dielectric layer 11 and piezoelectric layer 3 or further sense electrodes 7C may be formed atop piezoelectric layer 3. This flexibility, which is not possible for MIS type structures for reasons noted hereinabove, allows for greater design freedom than is possible with prior art ACT and HACT devices or with MIS type structures utilizing inversion layers.

Electrodes in HACT and ACT devices may in principle comprise any conductive material having appropriate acoustic properties (E.g., aluminum). However, the presence of and the power levels required for the SAW clocking signal as well as the unique concerns associated with effecting charge transport impose criteria for electrode composition and performance distinct from those of SAW filters, for example.

Acoustically clocked charge transport devices require (i) high conductivity electrode materials having (ii) high resistance to electro- and acousto-migration together with (iii) low acoustic propagation losses and providing electrodes having (iv) minimal acoustic reflection coefficients.

Requirement (i) must be met in at least the acoustic wave transducer area in order to reduce heating and attendant velocity and/or frequency shifts and also to prolong transducer operating life. Requirements (ii) through (iv) are significant throughout device length and apply to all electrodes exposed to ultrasound.

Requirement (iv) is met through choice of materials of similar density and stiffness to the material(s) on which the electrodes are disposed, through reduction of electrode thickness (typically electrodes are less than a few thousand Angstroms thick and may be only several hundred to a thousand Angstroms in thickness) and by employing electrode arrangements wherein the reflection coefficients of some electrode edges cancel the reflection coefficients of other electrode edges (e.g., use of electrodes one-eighth or one-sixth of a clock wavelength wide disposed on one-fourth or one-third of a clock wavelength centers, respectively) or by burying the electrodes in the substrate to minimize discontinuities (see, for example, U.S. Pat. No. 4,499,440, entitled "Low Reflectivity Electrodes In Semiconductive SAW Devices", by T. Grudkowski, issued Feb. 12, 1985, which is incorporated herein by reference).

Examples of materials satisfying requirements (i) through (iv) are precipitation-hardened aluminum alloys as described, for example, in U.S. Pat. No. 4,906,885, entitled "Electrode Material for Surface Acoustic Wave Devices and Surface Acoustic Wave Device Using The Same" by H. Kojima et al., issued Mar. 6, 1990; in U.S. Pat. No. 4,942,327, entitled "Solid State Electronic Device" by H. Watanabe et al., issued Jul. 17, 1990; and in U.S. Pat. No. 5,039,957, entitled "High Power Surface Acoustic Wave Devices Having Copper And Titanium Doped Aluminum Transducers And Long Term Stability" by J. Greer et al., issued Aug. 13, 1991, which patents are incorporated herein by reference. In NDS electrode arrays, it is important to reduce clock signal effects at the NDS array output while maintaining large-signal interactions between the clocking signal and the transported charge (the electrode array must not short-circuit the clocking potential).

This latter need may be realized through sparse sampling (placing sensing electrodes coupled to an output at separations greater than a clock signal wavelength) or, for example, by an array of one-eighth of a wavelength wide electrodes having one-fourth of a wavelength pitch wherein every fourth electrode may be coupled to a common buss and the clock signal removed by filtering the output signal derived from the common buss(es).

Image charges induced in NDS electrodes 7A and/or sense electrodes 7B and/or 7C are combined to form a transversal filter from which an output signal is derived.

A fundamental distinction between MIS-type devices and SST-type devices is apparent in comparison of the element factors (FIG. 3) appropriate to NDS electrodes. As representatively illustrated in FIG. 3, NDS element factor attenuation is dramatically less pronounced for NDS electrodes immediately above the charge packets than is the case for electrodes placed atop insulator structures, etc.

Figure 3:
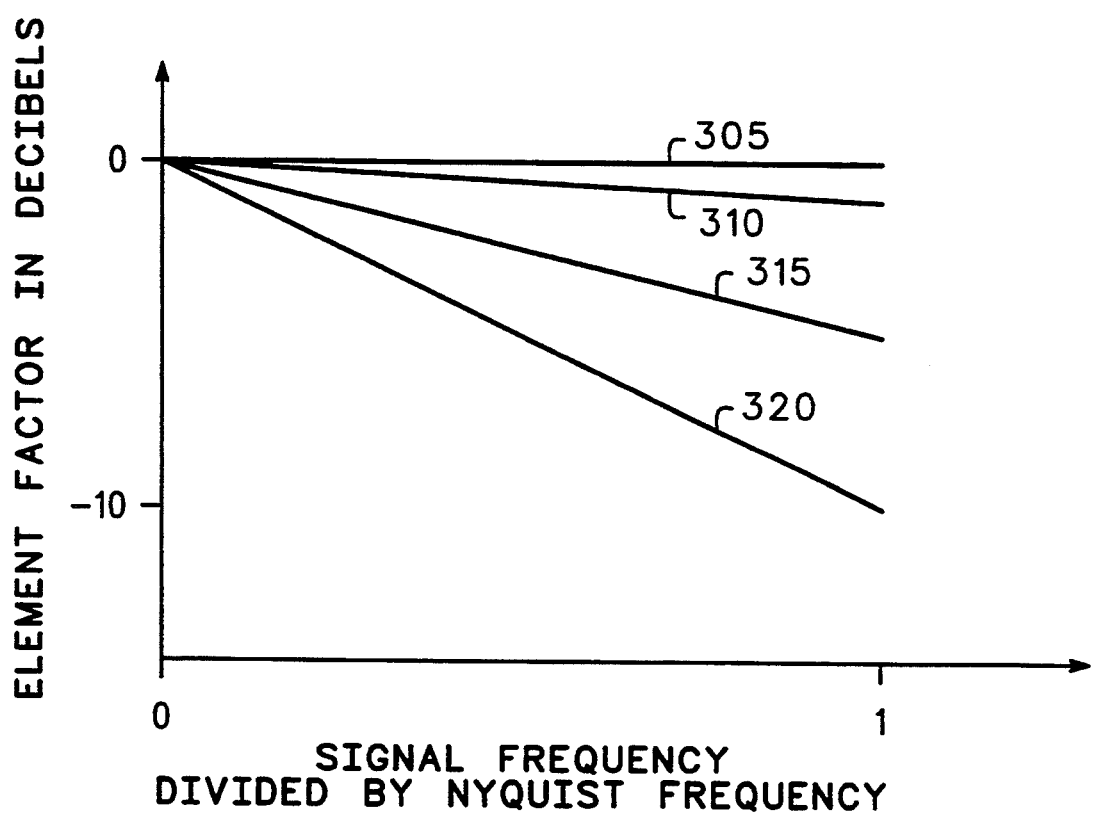
FIG. 3 is a graph of element factor attenuation.

In FIG. 3, logarithms of element factors (vertical axis) are shown for several charge packet depths versus signal frequency divided by the Nyquist frequency. The Nyquist frequency is simply the clocking frequency divided by two and which arises from the well-known Nyquist theorem.

In FIG. 3, reference level 305 corresponding to no element factor is shown above trace 310. Trace 310 corresponds to a HACT-type structure employing, for example, Schottky electrodes placed directly upon the channel surface and illustrating, for example, less than 1 dB of element factor attenuation at the Nyquist frequency.

Middle curve 315 illustrates a representative element factor corresponding, by way of example and not intended to be limiting, to a sense electrode placed atop dielectric material (e.g., an oxide or nitride layer such as dielectric layer 11 of FIG. 1, etc.) while bottom trace 320 corresponds to an element factor appropriate to a sense electrode placed farther above the channel (e.g., atop piezoelectric layer 3 of FIG. 1).

An element factor appropriate to the type of charge transfer device described in Hunsinger et al. (supra) provides approximately 10 dB of attenuation at the Nyquist frequency, a value appropriate for charge transport occurring at a depth of about 0.375 of the acoustic clocking signal wavelength below a sense electrode where the electrode is relatively narrow (e.g., one-eighth of a wavelength of the acoustic clocking signal broad).

The amount of element factor attenuation varies with separation of the charge packet from the sensing structure (i.e., the farther the charge is below the electrode, the greater the attenuation).

The well-known element factor, originally developed in the context of antenna theory, multiples that frequency response predicted by simply taking the Fourier transform of the weights of the sense electrodes. As a result, high frequency performance is substantially degraded from that otherwise possible when the thickness of the material between the sense electrode and the charge packets is increased.

Charge packets are then swept to delay line output contact 9, where a delayed replica of the input signal is extracted by application of a suitable bias voltage applied between delay line output Schottky gate contact 8 and delay line output contact 9. Finally, SAW energy is incident upon acoustic absorber 10 consisting of a mass of a suitable viscous material, such as a room temperature vulcanizing silicone rubber (RTV), to avoid unwanted effects resulting from reflection of SAW energy by edges of substrate 1.

In heterostructure acoustic charge transport devices, is is important that the electrical potential of the acoustic wave not be short circuited by metallic structures at the channel surface. Accordingly, electrodes which are substantially less than an acoustic wavelength in width (in the direction of acoustic wave propagation) are preferred.

Reduction of acoustic reflections from electrodes is also a concern. If substantial acoustic energy is reflected by a group of electrodes such as NDS electrodes, charge transport is no longer unidirectional and the HACT phenomenon is corrupted or ceases altogether. Reflections occur primarily because of mass loading of the surface and/or because of changes in the electrical boundary conditions (i.e., short-circuiting of electrical fields by metallic structures).

The latter source of reflections is in direct proportion to the elctromechanical coupling manifested by the substrate/channel/dielectric layer (if present)/piezoelectric overlayer combination. Accordingly, increasing the electromechanical coupling by including an overlayer of more piezoelectric material causes the acoustic reflections present in a device to increase.

This problem is alleviated by employing electrode configurations which reduce or eliminate acoustic reflections through cancellation of reflections from one electrode with reflections from a neighboring electrode. An example of such an electrode configuration is an array of one-eighth of an acoustic wavelength wide electrodes placed on one-fourth of an acoustic wavelength centers.

A typical HACT device channel structure suitable for use as channel 4 (FIG. 1) comprises (from substrate to dielectric layer 11 and/or thin-film overlay 3 of a piezoelectric material) (i) a buffer structure, (ii) a 1000 Angstrom thick not intentionally doped (NID) $Al_xGa_{1-x}As$ layer, (iii) a 400 Angstrom thick NID GaAs layer, (iv) a 700 Angstrom thick $Al_xGa_{1-x}As$ layer with an electron donor concentration (ND) of $2\times10^{17}/cm^3$ and (v) a layer of NID GaAs, typically 200 Angstroms thick. Electron transport is effected by the SAW clocking signal and occurs within layer (iii).

The buffer structure (i, supra) may comprise layer (ii, supra), a layer of GaAs or a superlattice buffer layer comprising alternating layers of NID GaAs and/or $Al_xGa_{1-x}As$ and/or AlAs, each in the range of 20–100 Angstroms thick. The mole fraction x of Al incorporated in $Al_xGa_{1-x}As$ may range from 0% to about 50%, is typically in the range from 20% to 40% and is desirably about 30%; other alloys including elements from columns III and V of the periodic table (known as III-V materials or III-V semiconductors) are also suitable as well as other alloys such as II-VI (e.g., CdS, etc.), II-IV-VI, etc.

Typically, GaAs substrata are employed, however, the principal requirement is that the channel layers have good lattice match to the substrate. Alternatively, strained or "pseudo-morphic" layers may be employed.

Typically, homoepitaxial (growth of a material on a single crystal substrate of the same material such that long and short range order are preserved in the grown layer) and heteroepitaxial (growth of heterostructures, e.g., a first material grown on a single crystal substrate of a second material such that long and short range order are preserved in the grown layer and such that these orders are related to the long range order present in the single crystal substrate) layers suitable for use in such structures are grown by liquid phase epitaxy or LPE, metalorganic vapor deposition or MOCVD, molecular beam epitaxy or MBE, metalorganic molecular beam epitaxy or MOMBE and/or similar processes as are well known in the art. Epitaxial growth services are available from a variety of vendors including PicoGiga of Paris, France and BandGap of Broomfield, Colo.

Alternatively, an epitaxial structure comprising different layers of a single semiconductor material (i.e., homostructures) may be employed. Examples of such homostructures include thin (e.g., generally less than 0.2, desirably less than 0.1 and preferably less than 0.05 of an acoustic clocking signal wavelength thick) epitaxial layers of p-, n- and/or nid-type material deposited to provide a high mobility channel layer having electrostatic boundary conditions at upper and lower surfaces thereof which prevent mobile charge (i.e., majority carriers) from leaving the channel region during the transport process.

For example, an n-type GaAs channel layer having $N_D=10^{17}/cm^3$ 0.2 micrometers thick and bounded above and/or beneath by p-type GaAs (or, for example, $Al_xGa_{1-x}As$) layers having $N_A=5\times10^{16}/cm^3$ 0.15 micrometers thick could be employed together with appropriate bias conditions and/or bias structures and an acoustic clocking signal having a wavelength of, for example, eight micrometers, although larger and smaller acoustic clocking signal wavelengths could be employed as well.

Alternatively, an n-type layer comprising approximately one-half micrometer of n-type GaAs having $N_D$ circa $5\times10^{16}/1\times10^{17}/cm^3$ may be employed without boundary layers wherein the top surface of the channel comprises, by way of example, a series of one-eighth of an acoustic clocking signal wavelength strips of conductive material disposed along the acoustic clocking signal wave propagation direction and the bottom surface is bounded by semi-insulating semiconductor material or a lightly doped p-type region disposed on semi-insulating semiconductor material.

It is desirable that substrate 1 be semi-insulating in order to reduce input-output coupling by capacitive coupling of the input and output structures to the substrate material. A broad variety of materials may be employed as substrata, but III-V semiconductor materials are preferred.

Important factors are (i) that the charge be transported within approximately one sixth and preferably one-eighth of a wavelength of the acoustic clocking signal of the top surface of the channel materials, (ii) that the charge be transported at least 200 Angstroms, desirably at least 400 Angstroms and preferably at least 600 Angstroms below a top surface of the semiconductor materials comprising the channel, (iii) that the material surrounding the channel be depleted of mobile carriers, (iv) that the transported charge within the channel is electrostatically constrained to remain in the channel, (v) that the acoustic clocking signal propagate in predominantly a single direction and (vi) that the substrate material be semi-insulating (i.e., have a bulk resistivity of $10^5$ Ω-cm, or greater).

Another important factor is that the channel material and the surrounding materials must have a bandgap $E_G$ which is large enough to avoid device performance degradation by excessive generation (or "dark") current and which will not give rise to substantial impact ionization effects under normal device operation conditions. For example, materials having narrow bandgaps, such as InSb ($E_G$ circa 0.16 electron Volts at 300° K. and one atmosphere) are not suitable for high frequency, high performance charge transport device channels.

Additionally, cubic crystals such as GaAs, Si, etc., provide surface wave propagation conditions free from unusual beamsteering or loss properties along most major crystalline axes (e.g., <100>, <110>, <111>) on most low index faces (e.g., {100}, {110}, {111}) with the exception of <110> propagation on {100} faces. For angles near a <110> axis, large acoustic losses result from coupling of surface acoustic waves to a lower velocity shear mode. Thus, surface acoustic wave propagation on {100} faces must be either along the <110> axis or at angles well removed from the <110> axes (i.e., a <100> axis).

The term "sub-surface transport" or "SST" is used herein to mean acoustic charge transport devices meeting conditions (i) and (ii) above. SST devices are distinct from MIS structures in that MIS structures employ confinement of (i) minority charge carriers at (ii) insulator-semiconductor interfaces by means of (iii) an externally supplied bias.

Features (i) through (iii) are absent in SST devices, including HACT devices, providing SST devices with advantages of decreased trapping and subsequent re-emission (of mobile charge carriers by spatially fixed trapping centers) and increased charge carrier mobility (charge transport is no longer occurring at a surface of a semiconductor material having attendant surface states), reduced fabrication and operation complexity and also of improved electrical input-output isolation (i.e., freedom from capacitively coupled interference signals at the output).

These advantages allow ACT, HACT and SST devices to provide orders of magnitude higher charge transfer efficiencies (e.g., 0.999+) at orders of magnitude greater clock frequencies (e.g., 360 and 600 MHz) than are possible for MIS-type structures (e.g., ZnO on Si, for example) with reduced spurious output signal levels. Charge carriers in SST devices are typically either majority carriers or charge carriers confined to an NID region, similar to HACT and ACT devices.

In conventional HACT or ACT devices, the very small ($k^2 = 7.4 \times 10^{-4}$) SAW electromechanical coupling coefficient dictates that the bulk of the SAW energy is mechanical energy, rather than electrical potential. As such, large amounts of acoustic power must be transduced by SAW transducer 2 in order to provide voltage levels required in order to effect charge carrier (e.g., electrons) bunching and subsequent transport of charge bunches, or packets, synchronously with the SAW, as is required for manifestation of the ACT phenomenon. The power level required to achieve a given electrical potential is directly related to total acoustic power level present through the electromechanical coupling coefficient, $k^2$.

Figure 2:
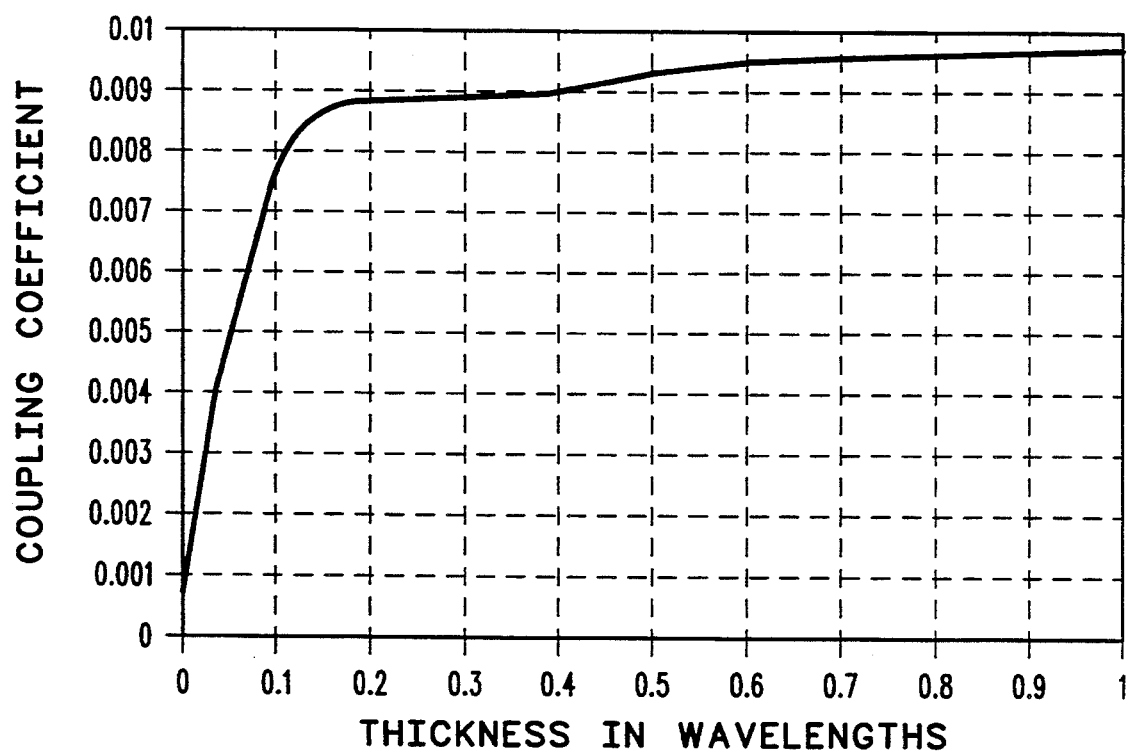
FIG. 2 is a graph of the electromechanical coupling coefficient versus ZnO layer thickness on a semi-insulating {100}-cut, <110>-propagating GaAs substrate.

As such, incorporation of more strongly piezoelectric overlayer 3, providing greater electromechanical coupling between the SAW and attendant electrical potential, results in reduced total acoustic power requirements to achieve a given electrical potential magnitude and so effect the HACT phenomenon. The degree of change in acoustic power requirements which can be effected is illustrated by the graph given in FIG. 2, for the case of Rayleigh waves propagating in the <110> direction on a {100}-cut GaAs substrate 1, versus thickness (in acoustic wavelengths) of a more strongly piezoelectric (e.g., ZnO) overlayer 3. As can be seen in FIG. 2, very thin layers 3 of ZnO result in dramatic improvements in electromechanical coupling coefficient magnitude, to about a thickness of appropriately 0.15 wavelengths (the coupling coefficient varies from about 0.0078 at a thickness of about 0.1 wavelength to about 0.0089 at a thickness of about 0.2 wavelengths). For thickner ZnO overlayers 3, as can be seen in FIG. 1, the increase in electromechanical coupling is seen to saturate at a value of about $k^2 = 0.01$.

Useful thicknesses of thin-layer piezoelectric overlayers 3 (FIG. 1) range from 0.01 to 1 acoustic wavelengths, desirably range from about 0.05 to about 0.3 acoustic wavelengths and preferably range from about 0.07 to about 0.2 wavelengths, with thicknesses such as 0.10, 0.11, 0.12, 0.13, 0.14, 0.15, 0.16 and 0.17 acoustic wavelengths being preferred.

More generally, the ratio of acoustic powers required to achieve the same electrical potential in different substrates 1 and overlayers 3 is given by:

$$P_{a,x}/P_{a,y} = (k_x^2 C_{s,x} v_{o,x})/(k_y^2 C_{s,y} v_{o,y})$$

where acoustic power for material x is denoted $P_{a,x}$, with a similar convention applying to other substrate parameters being compared; $k_x^2$ refers to electromechanical coupling coefficient; $C_{s,x}$ refers to characteristic capacitance per finger pair per cm. and $v_{o,x}$ refers to SAW velocity for substrate 1 or a composite materials system.

For the particular case of a thin-film ZnO layer 3 in FIG. 1 on a GaAs substrate 1, ranging from less than one to several micrometers in thickness, several different issues dictate inclusion of thin-film dielectric layer 11, intervening between ZnO layer 3 and GaAs substrate 1.

These issues devolve from poor adhesion which ZnO exhibits on GaAs substrates 1, evidenced by observed delamination of thin-film layers 3, excellent adhesion which ZnO layers 3 exhibit on $Si_3N_4$ dielectric layers 11, excellent adhesion of $Si_3N_4$ layers 11 to GaAs substrates 1, electronic effects which zinc (a rapid diffusant and a p-type dopant) and oxygen (a deep trap, removing carriers from the material and re-emitting them at random times with very long time constants) exhibit when incorporated into GaAs substrate 1 material and deleterious effects of ion bombardment of GaAs substrate 1 material during sputtering (e.g., utilized for deposition and growth of ZnO films 3), which are obviated by inclusion of intervening layer 11 of dielectric material.

Applicants have discovered that particular advantages accrue from use of thin film layers of hydrogenated silicon nitride and/or silicon oxy-nitride deposited by low pressure chemical vapor deposition based on decomposition of $NH_3$ and $SiH_4$.

Specific deposition conditions are outlined in "The Elastic Properties of Thin-Film Silicon Nitride" by Hickernell et al., 1990 Ultrasonics Symposium Proceedings and in "The Elastic Constants of PECVD Silicon Oxynitride" by Hickernell et al., 1991 Ultrasonics Symposium Proceedings which are incorporated herein by reference.

Specific advantages of PECVD nitride and oxynitride films include (i) very low acoustic propagation losses compared to most dielectric films, (ii) ease of patterning such films using conventional gas- or liquid-phase etching techniques, (iii) passivation of the semiconductor surface, (iv) excellent step coverage, (v) improved semiconductor surface breakdown performance under high electric fields and (vi) good adhesion of the dielectric film to both the piezoelectric layer and to the semiconductor substrate, in contrast to many dielectric films.

Acoustic propagation losses due to the inclusion of a low acoustic propagation loss film overlayers such as dielectric layer 11 are desirably less than 4 dB/microsencond at 400 MHz, preferably less than 3 dB per microsecond and optimally less than 2.5 dB/microsecond.

Inclusion of a thin film layer of a more piezoelectric material 3 on semiconductor substrate 1 including a HACT device thus results in substantial reduction of the acoustic energy level required in order to manifest the HACT phenomenon. Further, some combinations of thin-film overlay 3 and substrate 1 materials dictate incorporation of thin-film dielectric layer 11.

When thin-film piezoelectric layer 3 is also included over SAW transducer 2, a reduced area on semiconductor substrate 1 is required. This occurs through well-known relationships between SAW transducer parameters and results in greater operating bandwidth for SAW transducer 2. This increased bandwidth allows for greater variation in SAW frequency. This can be used to compensate for SAW transducer frequency shifts introduced by temperature or manufacturing variations. Reduced SAW transducer size allows for an increased number of HACT devices per wafer and so for reduced cost per device. Piezoelectric layer 3 may be applied only in the region of SAW transducer 2 to provide increased transducer bandwidth.

Alternatively, dielectric layer 11 and piezoelectric overlayer 3 may be combined by, for example, providing an epitaxial layer of AlN directly on the surface of channel 4. AlN is a wide bandgap semiconductor which can be prepared in insulating form and which may be grown on GaAs and similar materials by MOCVD, for example.

An additional advantage provided by the device architecture disclosed herein is that NDS electrodes having different element factors can be readily provided in a single, compact structure.

This is easily provided, for example by placing electrodes 7A (FIG. 1) (i) on the surface of channel 4, where NDS elements factors such as 310 (FIG. 3) obtain, placing electrodes 7B (FIG. 1) at an interface of dielectric layer 11 and piezoelectric overlayer 3, where NDS element factors such as 315 (FIG. 3) obtain and placing electrodes 7C (FIG. 1) atop dielectric layer 3 to provide a response similar to 320 (FIG. 3), providing a new degree of freedom in realizing a desired frequency response or family or frequency responses.

Thus, an acoustically clocked charge transport device having a piezoelectric overlayer has been described which overcomes specific problems and accomplishes certain advantages relative to prior art methods and mechanisms. The improvements over known technology are significant. The expense, complexities, and high fabrication complexity of CCDs are avoided.

Similarly, the advantages of high charge transfer efficiency, long charge storage times, high fidelity frequency response, low clocking signal power requirements, low dark current and additional flexibility in selecting frequency responses for individual sense electrodes are provided in compact form.

The foregoing description of the specific embodiments will so fully reveal the general nature of the invention that others can, by applying current knowledge, readily modify and/or adapt for various applications such specific embodiments without departing from the generic concept, and therefore such adaptations and modifications should and are intended to be comprehended within the meaning and range of equivalents of the disclosed embodiments.

It is to be understood that the phraseology or terminology employed herein is for the purpose of description and not of limitation. Accordingly, the invention is intended to embrace all such alternatives, modifications, equivalents and variations as fall within the spirit and broad scope of the appended claims.

What is claimed is:

1. A heterostructure acoustic charge transport (HACT) device comprising:
   a semiconductor substrate including:
      a surface;
      a source of electric charge;
      acoustic wave means coupled to said semiconductor substrate, said acoustic wave means operating in response to an applied voltage source to provide an acoustic wave to transport said electric charge, said acoustic wave means including an interdigital metallic wave transducer disposed along said semiconductor substrate;
      a HACT channel disposed along said surface of said semiconductor substrate, said HACT channel including heteroepitaxial semiconductor layers for transporting said electric charge in response to said acoustic wave means in a particular direction; and
   piezoelectric means disposed over said HACT channel, said piezoelectric means facilitating transportation of said electric charge in said particular direction of said HACT channel for reducing power consumption by said HACT device, wherein said HACT device further includes:
      a first plurality of nondestructive sensing Schottky electrodes having a first element factor, said first plurality connected to said top layer of said plurality of heteroepitaxial layers, each of said first plurality of electrodes providing a replica of said electric charge from said source; and a second plurality of sensing electrodes having a second element factor different than said first element factor, said second plurality of sense electrodes coupled to said top layer of said plurality of heteroepitaxial layers, each of said second plurality of electrodes providing a replica of said electric charge from said source.

2. A device as claimed in claim 1, further comprising a third plurality of sensing electrodes having a third element factor different than said first or said second element factors, said third plurality of sense electrodes coupled to said top layer of said plurality of heteroepitaxial layers, each of said third plurality of electrodes providing a replica of said electric charge from said source.

* * * * *